(12) United States Patent
Nadaud et al.

(10) Patent No.: US 9,073,781 B2
(45) Date of Patent: Jul. 7, 2015

(54) METHOD FOR DEPOSITING A THIN LAYER AND PRODUCT THUS OBTAINED

(75) Inventors: Nicolas Nadaud, Paris (FR); Andriy Kharchenko, Palaiseau (FR); Ulrich Billert, La Celle Saint-Cloud (FR); Rene Gy, Bondy (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 12/521,871

(22) PCT Filed: Jan. 4, 2008

(86) PCT No.: PCT/FR2008/050009
§ 371 (c)(1),
(2), (4) Date: Jul. 1, 2009

(87) PCT Pub. No.: WO2008/096089
PCT Pub. Date: Aug. 14, 2008

(65) Prior Publication Data
US 2010/0071810 A1    Mar. 25, 2010

(30) Foreign Application Priority Data
Jan. 5, 2007  (FR) ...................................... 07 52550

(51) Int. Cl.
| | | |
|---|---|---|
| C03C 17/09 | (2006.01) | |
| C03C 17/245 | (2006.01) | |
| C03C 17/36 | (2006.01) | |
| C03C 23/00 | (2006.01) | |
| C23C 14/58 | (2006.01) | |
| C30B 1/08 | (2006.01) | |
| H01L 31/0224 | (2006.01) | |
| H01L 31/18 | (2006.01) | |

(52) U.S. Cl.
CPC ............... *C03C 17/09* (2013.01); *Y10T 428/10* (2015.01); *C03C 17/2456* (2013.01); *C03C 17/36* (2013.01); *C03C 17/3681* (2013.01); *C03C 23/0025* (2013.01); *C03C 2217/212* (2013.01); *C03C 2217/256* (2013.01); *C03C 2217/71* (2013.01); *C03C 2217/944* (2013.01); *C03C 2218/32* (2013.01); *C23C 14/5806* (2013.01); *C23C 14/5813* (2013.01); *C30B 1/08* (2013.01); *H01L 31/022466* (2013.01); *H01L 31/1884* (2013.01); *Y02E 10/50* (2013.01)

(58) Field of Classification Search
CPC .................................. C03C 17/09; C23C 14/10
USPC .......................................................... 427/166
See application file for complete search history.

(56) References Cited

U.S. PATENT DOCUMENTS

| | | | |
|---|---|---|---|
| 5,093,207 A | 3/1992 | Hodes et al. | |
| 5,344,718 A | 9/1994 | Hartig et al. | |
| 5,376,455 A | 12/1994 | Hartig et al. | |
| 5,407,702 A * | 4/1995 | Smith et al. .................... | 427/211 |
| 5,512,152 A | 4/1996 | Schicht et al. | |
| 5,514,476 A | 5/1996 | Hartig et al. | |
| 5,557,462 A | 9/1996 | Hartig et al. | |
| 5,584,902 A | 12/1996 | Hartig et al. | |
| 5,770,321 A | 6/1998 | Hartig et al. | |
| 5,800,933 A | 9/1998 | Hartig et al. | |
| 6,042,752 A * | 3/2000 | Mitsui ......................... | 252/520.1 |
| 6,059,909 A | 5/2000 | Hartig et al. | |
| 6,300,594 B1 * | 10/2001 | Kinoshita et al. ......... | 219/121.69 |
| 6,395,398 B1 | 5/2002 | Nakashima et al. | |
| 6,635,321 B2 | 10/2003 | Wang et al. | |
| 6,641,689 B1 | 11/2003 | Aggas | |
| 6,686,050 B2 | 2/2004 | Lingle et al. | |
| 6,701,749 B2 | 3/2004 | Wang et al. | |
| 6,802,943 B2 | 10/2004 | Stachowiak | |
| 6,830,817 B2 | 12/2004 | Stachowiak | |
| 6,916,408 B2 | 7/2005 | Laird et al. | |
| 2001/0041252 A1 | 11/2001 | Laird | |
| 2002/0001028 A1 * | 1/2002 | Mori et al. ..................... | 347/228 |
| 2002/0031674 A1 | 3/2002 | Laird | |
| 2003/0165671 A1 * | 9/2003 | Hashimoto et al. ......... | 428/304.4 |
| 2003/0175529 A1 | 9/2003 | Stachowiak | |
| 2003/0197007 A1 | 10/2003 | Kim et al. | |
| 2004/0229073 A1 | 11/2004 | Dietrich et al. | |
| 2004/0253797 A1 | 12/2004 | Huang et al. | |
| 2006/0099428 A1 | 5/2006 | Butz et al. | |
| 2006/0141290 A1 | 6/2006 | Sheel et al. | |
| 2006/0220023 A1 * | 10/2006 | Hoffman et al. ................. | 257/72 |

(Continued)

FOREIGN PATENT DOCUMENTS

| | | |
|---|---|---|
| EP | 0 634 376 A1 | 1/1995 |
| EP | 0 646 660 A1 | 4/1995 |

(Continued)

OTHER PUBLICATIONS

U.S. Appl. No. 13/496,090, filed Mar. 14, 2012, Kharchenko, et al.

*Primary Examiner* — Weiping Zhu

(74) *Attorney, Agent, or Firm* — Oblon, McClelland, Maier & Neustadt, L.L.P.

(57) ABSTRACT

One subject of the invention is a process for the treatment of at least one thin continuous film deposited on a first side of a substrate, characterized in that said at least one thin film is raised to a temperature of at least 300° C. while maintaining a temperature not exceeding 150° C. on the opposite side of said substrate to said first side, so as to increase the degree of crystallization of said thin film while keeping it continuous and without a step of melting said thin film.

Another subject of the invention is the material that can be obtained by this process.

17 Claims, No Drawings

(56) References Cited

U.S. PATENT DOCUMENTS

| | | | |
|---|---|---|---|
| 2008/0008829 A1* | 1/2008 | Blacker et al. | 427/162 |
| 2008/0105293 A1* | 5/2008 | Lu et al. | 136/246 |

FOREIGN PATENT DOCUMENTS

| | | |
|---|---|---|
| EP | 0 676 379 A2 | 10/1995 |
| EP | 0 718 250 | 6/1996 |
| EP | 1 355 346 | 10/2003 |
| FR | 2 584 392 A1 | 1/1987 |
| JP | 02 258699 | 10/1990 |
| JP | 3-184216 A | 8/1991 |
| JP | 06 021459 | 1/1994 |
| JP | 7-114841 | 5/1995 |
| JP | 2002 088474 | 3/2002 |
| WO | WO 01/27050 A1 | 4/2001 |
| WO | 2004/013376 | 2/2004 |

* cited by examiner

METHOD FOR DEPOSITING A THIN LAYER AND PRODUCT THUS OBTAINED

The invention relates to the field of thin inorganic films, especially those deposited on glass substrates. It relates more particularly to a process for at least partially crystallizing said thin films and to certain products obtained using this process.

Many thin films are deposited on substrates, especially those made of flat or slightly curved glass, so as to give the materials obtained particular properties, namely: optical properties, for example reflection or absorption properties for radiation with a given wavelength range; particular electrical conduction properties; or else properties associated with ease of cleaning or with the possibility of the material being self-cleaning.

These thin films are usually based on inorganic compounds, such as oxides or nitrides, or else on metals. Their thickness generally varies from a few nanometers to a few hundred nanometers, hence they are termed "thin".

To give examples, mention may be made of thin films based on indium tin mixed oxides (called ITOs), based on indium zinc mixed oxides (called IZOs), based on gallium-doped or aluminum-doped zinc oxide, based on niobium-doped titanium oxide, based on cadmium or zinc stannate, or based on fluorine-doped and/or antimony-doped tin oxide. These various films have the particular feature of being transparent, but nevertheless conductive or semi-conductive, films and are employed in many systems in which these two properties are necessary: liquid crystal displays (LCDs), solar or photovoltaic sensors, electrochromic or electroluminescent devices, etc.

Thin films based on metallic silver or metallic molybdenum or niobium may also be mentioned that have electrical conduction properties and properties for reflecting infrared radiation, hence their use in solar-control glazing, especially solar-protection glazing (with the aim of reducing the amount of incoming solar energy) or low-emissivity glazing (with the aim of reducing the amount of energy dissipated to the outside of a building or a vehicle).

Thin films based on titanium oxide may also be mentioned that have the particular feature of being self-cleaning, making it easier for organic compounds to be degraded under the action of ultraviolet radiation and for mineral contamination (dust) to be removed through the action of running water.

The various films mentioned have the common feature of seeing some of their properties improved when they are in an at least partially crystallized state. In general, the aim is to maximize the degree of crystallization (the proportion by weight or by volume of crystallized material) of these layers and the size of the crystalline grains (or the size of the coherent diffraction domains measured by X-ray diffraction methods), or in certain cases to promote a particular crystallographic form.

In the case of titanium oxide, it is known that titanium oxide crystallized in the anatase form is much more effective in terms of organic compound degradation than amorphous titanium oxide or titanium oxide crystallized in the rutile or brookite form.

It is also known that silver films having a high degree of crystallization, and consequently a low residual content of amorphous silver, have a lower emissivity and a lower resistivity than predominantly amorphous silver films. The electrical conductivity and the low-emissivity properties of these films are thus improved.

Likewise, the aforementioned transparent conductive films, especially those based on doped zinc oxide or tin-doped indium oxide films, have a higher electrical conductivity the higher their degree of crystallization.

One process commonly employed on an industrial scale for the deposition of thin films, especially on a glass substrate, is the magnetically enhanced sputtering process, called magnetron sputtering. In this process, a plasma is created in a high vacuum close to a target comprising the chemical elements to be deposited. The active species of the plasma, which bombard the target, tear off said elements, which are deposited on the substrate, thus forming the desired thin film. This process is said to be "reactive" when the film consists of a material resulting from a chemical reaction between the elements torn off the target and the gas contained in the plasma. Thus, it is known to deposit titanium oxide films by the reactive magnetron sputtering process employing a metallic titanium target and an oxygen-based plasma gas. The major advantage of this process lies in the possibility of depositing a very complex multilayer coating on the same line, by making the substrate run in succession beneath various targets, this generally being carried out in one and the same device.

When implementing the magnetron sputtering process on an industrial scale, the substrate remains at ambient temperature or is raised to a moderate temperature (below 80° C.), particularly when the run speed of the substrate is high (which is generally desirable for economic reasons). What may seem to be an advantage constitutes however a drawback in the case of the aforementioned films, since the low temperatures involved do not in general allow sufficient crystalline growth. This is most particularly the case for thin films of small thickness and/or films made of materials having a very high melting point. The films obtained according to this process are therefore predominantly, or even completely, amorphous or nanocrystallized (the average size of the crystalline grains being less than a few nanometers), and heat treatments prove to be necessary in order to obtain the desired degree of crystallization or the desired grain size.

Possible heat treatments consist in reheating the substrate either during deposition or after deposition, upon leaving the magnetron line. Most generally, temperatures of at least 200° C. or 300° C. are necessary. The crystallization is better and the grain size larger the closer the temperature of the substrate is to the melting point of the material constituting the thin film.

In industrial magnetron lines, heating of the substrate (during deposition) proves however to be difficult to implement, in particular since heat transfer in a vacuum, which is necessarily radiative by nature, is difficult to control and is very costly in the case of large substrates measuring several meters in width. In the case of glass substrates of small thickness, there is often a very high risk of breakage in this type of treatment.

Heating the coated substrate after deposition, for example by placing the substrate in a furnace or an oven or subjecting the substrate to infrared radiation coming from conventional heaters, such as infrared lamps, also has drawbacks as these various processes contribute to heating the substrate and the thin film without distinction. Heating the substrate to temperatures above 150° C. is liable to cause breakages in the case of large substrates (those several meters in width) as it is impossible to ensure the same temperature over the entire width of the substrate. Heating the substrates also slows down the entire process, as it is necessary to wait while the substrates completely cool down before it can be envisaged cutting them or storing them, which generally takes place by stacking the substrates one on top of another. Very controlled cooling is also essential in order to prevent the generation of stresses within the glass, and therefore the possibility of breakages. Since such very controlled cooling is very expensive, the annealing treatment is generally not sufficiently controlled to remove the thermal stresses within the glass, thereby increasing the number of in-line breakages. The annealing treatment also has the drawback of making it more difficult to cut the glass, cracks having a lower tendency to propagate linearly.

Substrate heating does take place if the glazing is bent and/or tempered, since the glass is reheated to above its softening temperature (generally above 600° C., or even 700° C. for a few minutes). The tempering or bending treatment therefore allows the desired result, of crystallizing the thin films, to be obtained. However, it would be expensive for all glazings to be subjected to such treatments for the sole purpose of improving the crystallization of the films. Furthermore, the tempered glazing can no longer be cut, and certain thin-film multilayer coatings cannot withstand the high temperatures suffered during the tempering of the glass.

One aim of the invention is to provide a process for improving the crystallization properties of many thin films, without however having the abovementioned drawbacks.

For this purpose, one subject of the invention is a process for the treatment of at least one thin continuous film deposited on a first side of a substrate, characterized in that each point on said at least one thin film is raised to a temperature of at least 300° C. while maintaining a temperature not exceeding 150° C. at any point on the opposite side of said substrate to said first side, so as to increase the degree of crystallization of said thin film while keeping it continuous and without a step of melting said thin film.

The term "thin continuous film" is understood within the context of the present invention to mean that the film covers substantially the entire substrate or, in the case of a multilayer coating, the entire subjacent film. It is important that the continuous character of the thin film (and therefore its advantageous properties) be preserved by the treatment according to the invention.

The term "point on the film" is understood to mean an area of the film undergoing the treatment at a given instant. According to the invention, the entire film (and therefore each point) is raised to a temperature of at least 300° C., but each point on the film is not necessarily treated simultaneously. The film may be treated at the same instant in its entirety, each point on the film being simultaneously raised to a temperature of at least 300° C. Alternatively, the film may be treated so that the various points on the film or sets of points are raised in succession to a temperature of at least 300° C., this second method being more often employed in the case of continuous implementation on an industrial scale.

The process according to the invention provides sufficient energy to promote the crystallization of the thin film, by a physico-chemical mechanism of crystalline growth around nuclei already present in the film, remaining in the solid phase. The process according to the invention does not involve a crystallization mechanism by cooling from a molten material, on the one hand as this would require raising the thin film to extremely high temperatures in order to melt it and, on the other hand, as this would be liable to modify the thicknesses and/or the refractive indexes of the films, and therefore their properties. This would in particular modify their optical appearance, generating inhomogeneities detectable to the eye.

The process according to the invention has the advantage of heating only the thin film (or the thin films in the case of a multilayer coating) without significantly heating the entire substrate. Thus, it is no longer necessary to subject the substrate to controlled slow cooling before the glass is cut or stored. This process also makes it possible to integrate a heating device on existing continuous production lines, more particularly in the space located between the exit of the vacuum deposition chamber of the magnetron line and the device for storing the glass in stacks. It is also possible in certain cases to carry out the treatment according to the invention within the actual vacuum deposition chamber.

In industrial implementation incorporating a magnetron line, the process is generally continuous in the sense that the substrate is running through it, and therefore undergoes a linear movement in a direction X. Each point on the thin film is therefore preferably treated according to one of the following methods: either the heating means are fixed and a set of points forming a line along a direction Y perpendicular to the direction X may be treated simultaneously, or the heating means can move along the direction Y and each point is treated in succession. The process according to the invention may be implemented on a substrate placed either horizontally or vertically. It may also be implemented on a substrate provided with thin films on both its sides, at least one film on one of the sides or on each side being treated according to the invention. In the case where thin films deposited on both sides of the substrate are treated according to the invention, it is possible to treat said thin films on each side either simultaneously, or in succession, by identical or different techniques, in particular depending on whether the nature of the treated films is the same or different. The case in which the treatment according to the invention is carried out simultaneously on both sides of the substrate is therefore well within the scope of the invention.

It is not physically possible to heat the film without heating the substrate, since raising the temperature within the film necessarily leads, by thermal conduction mechanisms, to heating of the substrate zone closest to the film and therefore to a high thermal gradient in the thickness of the substrate. Such high thermal gradients, sometimes called thermal shocks, are known to systematically cause breakages in the case of the soda-lime-silica glasses commonly employed in the flat glass industry. These breakages, which stem from the difference in thermal expansion between the various regions of the glass subjected to different temperatures, occur more easily in the case of soda-lime-silica glasses as their expansion coefficient is quite high. They also occur more easily in the case of large substrates (measuring at least 1 m, or even 2 or even 3 m in width) as it is more difficult to ensure high temperature uniformity in the case of large substrates.

The inventors have however shown that a heat treatment involving only moderate controlled heating of a limited region of the substrate gets round this breakage problem, hitherto deemed to be inevitable. It is therefore essential when implementing the present invention for the temperature of the opposite side of the substrate to the side bearing the treated thin film not to be above 150° C. This feature is obtained by choosing a method of heating especially adapted to heating the thin film and not the substrate, and by controlling the heating time or the heating intensity and/or other parameters depending on the heating method employed, as will be described in greater detail in the rest of the text.

One feature common to all the heating methods that can be used according to the invention lies in the fact that they make it possible to generate an extremely high power per unit area, something which cannot however be quantified absolutely, as it depends on many factors among which are the nature and the thickness of the thin film. This high power per unit area makes it possible to achieve the desired temperature in the film extremely rapidly (generally in a time not exceeding 1 second) and consequently to limit the duration of the treatment correspondingly, the heat generated not therefore having the time to diffuse into the substrate. Each point on the thin film is subjected to the treatment according to the invention (i.e. raised to a temperature of 300° C. or higher) for a time generally not exceeding 1 second, or even 0.5 seconds. By contrast, since the infrared lamps conventionally used do not allow these high levels of power per unit area to be achieved, the treatment time must be longer (often several seconds) in order to reach the desired temperatures, and the substrate is then necessarily raised to high temperatures by heat diffusion, even if the wavelength of the radiation is adapted so as to be absorbed only by the thin film and not by the substrate.

To minimize the number of breakages in the case of the largest substrates (for example measuring 6 m in length by 3 m in width), a temperature not exceeding 100° C., especially 50° C., is preferably maintained over the entire treatment at any point on the opposite side of the substrate to the side on which the thin film is deposited.

Another advantage of the invention lies in the fact that the process subjects the thin film or thin-film multilayer coating to the equivalent of a tempering operation. It turns out that certain thin-film multilayer coatings have their optical properties (colorimetric coordinates, light transmission or energy transmission) modified when the glass is tempered. The process according to the invention therefore makes it possible to obtain an untempered glass (therefore one not having within it a stress profile specific to the tempered glass, which would make it cutable) but having substantially the same optical properties as if it had been tempered.

The degree of crystallization obtained using the process according to the invention is preferably at least 20% or 50%, especially 70% and even 90%. This degree of crystallization, defined as the mass of crystallized material to the total mass of material, may be determined by X-ray diffraction using the Rietveld method. Owing to a crystallization mechanism by crystalline grain growth from nuclei or seeds, the increase in the degree of crystallization is generally accompanied by an increase in the size of the crystallized grains or of the coherent diffraction domains measured by X-ray diffraction.

The substrate is preferably transparent, made of glass, especially soda-lime-silica glass. It may also be made of plastic, such as polycarbonate or polymethyl methacrylate. Advantageously, it has at least one dimension of 1 m or higher, or 2 m and even 3 m. The thickness of the substrate generally varies between 0.5 mm and 19 mm, the process according to the invention being particularly advantageous in the case of thinner substrates having a thickness not exceeding 4 mm, or even 2 mm.

The thin film is preferably a film having at least one property improved when the degree of crystallization of said film increases. For the abovementioned reasons, and owing to the correlation between properties and degree of crystallization, the thin film is preferably based on a metal, an oxide, a nitride or a mixture of oxides chosen from silver, molybdenum, niobium, titanium oxide, indium zinc or indium tin mixed oxides, aluminum-doped or gallium-doped zinc oxide, titanium, aluminum or zirconium nitrides, niobium-doped titanium oxide, cadmium stannate and/or tin stannate, fluorine-doped and/or antimony-doped tin oxide. It even preferably consists of such a metal, oxide, nitride or mixture of oxides. The thickness of the thin film is preferably between 2 and 500 nm.

Most of the abovementioned thin films have the particular feature of being overall transparent to UV-visible radiation (the absorption being less than 50% in the visible range). Since their absorption spectrum is little different from that of the substrate (especially in the case in which the latter is made of glass), it is especially difficult to heat specifically the film, and not the substrate. Other films, such as silicon films, have a high absorption in the visible and in the near infrared, thereby making it easier for them to be selectively heated, for example in the case of transforming amorphous silicon to polycrystalline silicon.

The thin film treated according to the invention may be the only thin film deposited on the substrate. It may also be included in a thin-film multilayer coating comprising thin films, generally chosen from oxides, nitrides or metals. The thin film may also itself be a thin-film multilayer coating. If the treated thin film is included in a thin-film multilayer coating, the process according to the invention may improve the crystallization properties of one or more thin films of the multilayer coating.

When the thin film is a silver or silver-based film, it is preferably included in a thin-film multilayer coating, especially so as to prevent it from oxidizing. In the case of solar-control or low-emissivity glazing, the silver-based thin film is generally placed between two oxide-based or nitride-based dielectric thin films. It is also possible to place beneath the silver film a very thin film intended to promote the wetting and nucleation of the silver (for example a film of zinc oxide ZnO) and on the silver film a very thin second film (a sacrificial film, for example made of titanium) intended to protect the silver film if the subsequent film is deposited in an oxidizing atmosphere or in the case of heat treatments resulting in oxygen migration into the multilayer coating. The multilayer coatings may also comprise several silver films, each of these films generally being affected by the implementation of the process according to the invention. If the multilayer coating comprises a zinc oxide film, the treatment of the silver film is generally also accompanied by an increase in the degree of crystallization of the zinc oxide.

When the thin film is a transparent conductive film, for example one based on gallium-doped and/or aluminum-doped zinc oxide, it may be included in a multilayer coating comprising at least one underlayer forming a barrier to the migration of alkali metals and/or at least one overlayer acting as oxidation barrier. This type of multilayer coating is for example described in the application WO 2007/018951 incorporated by reference into the present application. However, the treatment according to the invention advantageously makes it possible to dispense with this type of underlayer or overlayer, since the rapidity of the heating causes very little migration of alkali metals or oxygen, compared with an annealing or tempering treatment. This is all the more advantageous if the conductive film has to serve as an electrode and must therefore be in direct electrical contact with other functional films (for example in the case of photovoltaic or OLED applications): in the case of a tempering or annealing treatment, the overlayer providing oxidation protection is necessary during the treatment and must then be removed. Thanks to the process according to the invention, it is possible to dispense with this overlayer.

The film based on titanium oxide is preferably a film made of titanium oxide (optionally doped). The entire surface of this film is preferably in contact with the outside so that the titanium oxide can fully fulfill its self-cleaning function. To further improve the crystallization of these films, it is possible to provide beneath the titanium-oxide-based film an underlayer having the effect of promoting the crystalline growth of the titanium oxide, especially in anatase form. This may especially be a $ZrO_2$ underlayer, as described in application WO 02/40417, or else an underlayer promoting the heteroepitaxial growth of the titanium oxide in anatase form, as described for example in application WO 2005/040058 incorporated by way of reference, especially a $BaTiO_3$ or $SrTiO_3$ film.

The thin film before treatment according to the invention may be obtained by any type of process, in particular processes that generate predominantly amorphous or nanocrystallized films, such as the magnetron sputtering process, the plasma-enhanced chemical vapor deposition (PECVD) process, the vacuum evaporation process or the sol-gel process. However, it is preferably a "dry" film, containing no aqueous or organic solvent, as opposed to a "wet" film obtained for example by the sol-gel process. It is preferably obtained by sputtering, especially magnetron sputtering. In the case of a film obtained by the sol-gel process, precursors in solution (sol) are deposited on the substrate, the film obtained then being dried and annealed so as to remove any trace of solvent. In this case, the energy provided by the heating then serves predominantly to remove this solvent, without necessarily affecting the crystallization properties of the film, and it is consequently more difficult to improve said properties in a time short enough not to also heat the substrate.

For greater simplicity, the film is preferably heated in air and/or at atmospheric pressure. Certain heating methods are however compatible with a vacuum, and it may be advantageous to heat the film within the actual vacuum deposition chamber, for example before a subsequent deposition.

Various heating means allowing a very high power per unit area to be generated can be used for implementing the process according to the invention. The heating parameters, such as the power of the heating means or the heating time, are adapted on a case-to-case basis by a person skilled in the art according to various parameters, such as the nature of the heating process, the thickness or the nature of the film, the size and the thickness of the substrates to be treated, etc.

When the thin film is electroconductive (for example in the case of a silver film), it can be heated by induction heating.

The induction heating of metal parts is a process well known for achieving high temperatures in a rapid and controlled manner within bulk conductive parts (reinforcement of steels, zone refining of the silicon, etc.). The main applications relate to the agri-food field (heating of vessels, cooking of flat products on metal belts, extrusion-cooking) and to the field of metal manufacturing (smelting, reheating before forming, bulk heat treatment, surface heat treatment, treatment of coatings, welding, brazing).

An AC current flowing through a coil (also called a solenoid or turn) generates within it a magnetic field oscillating at the same frequency. If an electrically conductive part is placed inside the coil (or solenoid), currents induced by the magnetic field are generated and heat the part by the Joule effect.

The currents appear on the surface of the part to be heated. A characteristic parameter called the skin depth may be defined, giving to a first approximation the thickness of the film in which the current flows. The skin depth of the currents depends on the nature of the metal heated and decreases when the frequency of the current increases.

In the case of heating an insulating substrate covered with a conductive film, it is preferable to use a high-frequency polarization so as to concentrate the influence of the inductor on the surface portion of the material. The frequency is preferably between 500 kHz and 5 MHz, especially between 1 MHz and 3 MHz. An inductor especially adapted for the treatment of flat surfaces is preferably employed.

Induction heating is not preferred when the thin film has a thickness of less than 20 nm, or even less than 10 nm. For such particularly thin films, a very high frequency is necessary and, since the volume of the film is very small, the efficiency of the treatment is compromised.

When the thin film absorbs at least part of the infrared radiation, it may be heated using radiation having a wavelength lying within said part of the infrared radiation absorbed by said film. To minimize the supply of heat to the substrate, the wavelength of the radiation chosen is preferably not within that part of the infrared radiation absorbed by the substrate. For the abovementioned reasons, the radiation must be characterized by a high power per unit area. For this reason, the thin film is preferably heated using a laser emitting infrared radiation. Systems based on infrared lamps associated with a focusing device enabling high levels of power per unit area to be achieved can also be used.

In the case of a film based on titanium oxide, it is preferable to employ a laser emitting radiation having a wavelength between 5 and 15 microns, for example a $CO_2$ laser emitting radiation with a wavelength of 10.6 microns. In the case of a silver-based film, it is preferable to employ a laser emitting radiation having a wavelength between 0.5 and 5 microns. A neodymium-doped YAG (yttrium aluminum garnet, $Y_2Al_{15}O_2$) laser emitting, in continuous or pulsed mode, radiation of around 1 micron in wavelength proved to be particularly suitable, especially when the substrate does not absorb in this wavelength range, which is the case for clear glass in which the weight content of iron oxide is 0.1% or less.

The use of excimer lasers emitting radiation in the ultraviolet range is also possible for films that absorb such radiation.

For greater simplicity of implementation, the lasers employed within the context of the invention may be fiber-guided lasers, which means that the laser radiation is injected into an optical fiber and then delivered close to the surface to be treated via a focusing head. The laser may also be a fiber laser, in the sense that the amplifying medium is itself an optical fiber.

Since lasers can irradiate only a small area (typically of the order of a fraction of a $mm^2$ to several hundred $mm^2$), it is necessary, in order to treat the entire surface, to provide a system for moving the laser beam in the plane of the substrate, or a system forming a laser beam as a line that simultaneously irradiates the entire width of the substrate, beneath which line the substrate runs.

The thin film may also be heated by thermal spraying techniques, especially by a plasma spraying technique.

A plasma is an ionized gas generally obtained by subjecting what is called a "plasma gas" to excitation, such as a high DC or AC electric field (for example an electric arc). Under the action of this excitation, electrons are torn out of the atoms of the gas and the charges thus created migrate toward the oppositely charged electrodes. These charges then excite other atoms of the gas by collision, creating by an avalanche effect a homogeneous or microfilamentary discharge or else an arc. The plasma may be a "hot" plasma (the gas is thus entirely ionized and the plasma temperature is of the order of $10^{6\circ}$ C.) or a "thermal" plasma (the gas is almost entirely ionized and the plasma temperature is of the order of $10^{4\circ}$ C., for example in the case of electric arcs). The plasmas contain many active species, i.e. species capable of interacting with matter, including ions, electrons or free radicals. In the case of a plasma torch, a gas is injected into an electric arc and the thermal plasma formed is blown onto the substrate to be treated. The plasma torch is commonly employed to deposit thin films on various substrates by adding precursors in powder form to the plasma.

Within the context of the invention, the plasma torch is preferably combined with an automatic movement system located perpendicular to the direction in which the coated substrate runs and enabling the entire surface to be treated by the torch moving successively back and forth above the substrate.

The injected gas is preferably nitrogen, air or argon, advantageously having a hydrogen volume content of between 5 and 50%, especially between 15 and 30%.

The thin film may also be heated by subjecting it to the action of at least one flame.

This flame treatment is preferably carried out on a flame treatment rig located perpendicular to the run direction of the substrate. The length of the flame treatment device is preferably at least equal to the width of the coated substrate, thereby easily enabling the treatment to be carried out on the run, that is to say without requiring a displacement system. The gas used may be a mixture of an oxidant gas, chosen especially from air, oxygen or mixtures thereof, and a combustible gas, chosen in particular from natural gas, propane, butane, or even acetylene or hydrogen, or mixtures thereof. Oxygen is preferred as oxidant gas, in particular in combination with natural gas (methane) or propane, on the one hand because it enables higher temperatures to be achieved, consequently shortening the treatment and preventing the substrate from being heated, and, on the other hand, because it prevents the creation of nitrogen oxides $NO_x$. To achieve the desired temperatures at the thin film, the coated substrate is generally positioned within the visible flame, especially in the hottest region of the flame, a portion of the visible flame then extending around the treated region.

Flame treatment is a technique widely employed for treating the surface of polymers so as to improve their wettability properties and to make it easier for them to be coated with paints. In the use to which flame treatment is put, the principle is to subject the surface to be treated to the action of radicals created by the combustion, without raising said surface to a high temperature. Application US 2006/128563 describes the use of this technique for activating surfaces of titanium oxide films so as to improve their hydrophilicity properties. The treatments described, which are quite similar to those carried out on polymer substrates, consist in making a substrate run through or slightly below (a few centimeters below) the tip of the visible flame. This type of treatment, which aims to create hydroxyl groups on the surface of the titanium oxide, is however not suitable for raising the thin titanium oxide film to temperatures above 200° C. and for increasing the degree of crystallization of the titanium oxide, since the temperatures in the tip of the visible flame are insufficient.

The thin film may also be heated using radiation in the microwave range (with wavelengths ranging from 1 millimeter to 30 centimeters, i.e. frequencies ranging from 1 to 300 GHz).

The thin film may also be heated by bringing it into contact with a hot solid or a hot liquid. This may for example be a rotatable heated roll in contact with which the substrate coated with the thin film to be heated runs. The roll may be cylindrical or comprise a multiplicity of facets, thus enabling the area of contact between the roll and the substrate to be increased. The hot solid, preferably in roll form, is preferably made of a flexible material so as to be able to conform to any surface irregularities or deformations of the substrate. It preferably has a high thermal conductivity so as to obtain good heat transfer to the surface of the substrate. The solid is preferably raised to temperatures of at least 500° C., or 600° C. and even 700° C.

Induction heating and flame heating methods are preferred when it is desired not to use a mechanical displacement device above the substrate. Infrared radiation or induction heating methods may themselves be employed within the vacuum deposition device of the magnetron line. These are also advantageous when it is desired not to consume large quantities of gas.

When the thin film is based on titanium oxide (or consists of titanium oxide), one preferred embodiment of the invention consists in raising said thin film to a temperature of between 300 and 800° C., preferably between 400 and 600° C., so that said thin film comprises titanium oxide in anatase form. As indicated above, such crystallization enables the photocatalytic activity of titanium oxide to be considerably increased. The film is preferably heated by one of the following techniques:

by contact with a hot solid at a temperature of 400° C. or higher;
by heating using a plasma torch;
by using a $CO_2$ laser emitting radiation having a wavelength of the order of 10 microns; and
by subjecting said thin film to the action of at least one flame.

The process according to the invention is particularly advantageous in the case of titanium oxide, since when a substrate containing alkali metal ions (for example a glass of the soda-lime-silica type) is raised to a high temperature, said ions have a tendency to diffuse into the titanium oxide film, thereby very considerably reducing, or even eliminating, its photocatalytic properties. For this reason, it is common practice to interpose a barrier layer between the thin titanium oxide film and the substrate so as to prevent migration of alkali metals, as taught in application EP-A-0 850 204, or to increase the thickness of the titanium oxide film so that at least the outermost surface of the film is not contaminated, as taught in application EP-A-0 966 409. In the case of the process according to the invention, the substrate is practically not heated and consequently the migration of alkali metals is virtually zero. The process according to the invention therefore makes it possible to obtain substrates made of soda-lime-silica glass coated directly with a thin titanium oxide film (for example with a thickness of the order of 10 nanometers) which nevertheless has a very high photocatalytic activity.

When the thin film is based on silver (or consists of silver), said thin film is preferably raised to a temperature of between 300 and 600° C., preferably between 350 and 550° C. The preferred techniques are laser heating, using a laser emitting infrared radiation, induction heating, plasma heating or flame heating.

It has been observed in the case of silver-based films that overly long heating or excessively intense heating, especially using a laser emitting in the infrared or induction heating, could not only result in raising the temperature of the substrate but also in destroying the continuity of the film, thus creating, from an initially continuous film, a discontinuous film comprising isolated silver nodules, producing a haze by direct observation or under strong illumination. This embodiment is obviously undesirable and is not included within the scope of the invention.

Another subject of the invention is a process for obtaining a material comprising a substrate and at least one thin film, characterized in that said at least one thin film is deposited on said substrate by magnetically enhanced (magnetron) sputtering and in that said at least one thin film is subjected to a heat treatment according to the invention.

Yet another subject of the invention is materials that can be obtained by the process according to the invention.

This is because the process according to the invention enables materials to be obtained that include a thin film having a degree of crystallization that could be obtained only by tempering, bending or annealing heat treatments, or else by treatments affecting the entire substrate during deposition. The materials obtained according to the invention therefore are differentiated from the known materials of the prior art by a different structure, especially by the fact that they do not have, in their thickness, a stress profile characteristic of that of a tempered glass and/or they do not give rise to the same diffusion of elements (alkali metals, oxygen, etc.) coming from the substrate or from the outside.

Such a material consists for example of a substrate made of untempered glass coated with a thin-film multilayer coating that includes at least one silver film with a thickness e (expressed in nm). The multilayer coating is characterized by a sheet resistance $R_\square$ (expressed in ohms) satisfying the formula:

$$R_\square \times e^2 - 120 < 25 \times e.$$

The sheet resistance of a thin conductive film depends on its thickness according to the Fuchs-Sondheimer law, which is expressed as: $R_\square \times e^2 = \rho \times e + A$. In this formula, $\rho$ denotes the intrinsic resistivity of the material forming the thin film and A corresponds to the specular or diffuse reflection of the charge carriers at the interfaces. The invention makes it possible to improve the intrinsic resistivity $\rho$, such that $\rho$ does not exceed 25 and to improve the reflection of the carriers such that A does not exceed 120, preferably 110 and even 105.

The process according to the invention thus makes it possible to obtain films having very low resistivities, which hitherto could only be obtained using a tempering treatment. However, since the glass is untempered, it does not have in its thickness the stress profile characteristic of a tempered glass (the presence of extensional stresses in the core of the glass and compressional stresses at the two surfaces), and is consequently cutable.

The multilayer coating is preferably of the type described previously in the present text, or in the following applications: WO 2007/110552, WO 2007/101964, WO 2007/101963, WO 2007/054656, WO 2007/054655, WO 2007/042688, WO 2007/042687, WO 2005/110939, WO 2005/051858, WO 2005/019126, WO 04/043871, WO 00/24686, WO 00/29347, EP 0995724, EP 0995725, WO 99/45415, EP 922681, EP 894774, EP 877006, EP 745569, EP 718250, incorporated by reference.

A material according to the invention also consists of a substrate made of glass of the soda-lime-silica type coated with at least one thin film comprising titanium oxide (and especially consisting of titanium oxide) at least partially crystallized in anatase form, which can be obtained by the process according to the invention. This material is distinguished from substrates coated with a titanium oxide film deposited by magnetron sputtering on a hot substrate and/or annealed in a furnace in that the titanium oxide film (or any underlayers) contains less sodium oxide coming from the substrate. This is because, since the process does not involve substantial heating of the substrate, the sodium ions have a very substantially lower tendency to diffuse into the titanium-oxide-based film. Preferably, the titanium-oxide-based film is deposited directly on the substrate, with no intermediate layer. It may also be deposited on intermediate layers not having properties acting as a diffusion barrier to alkali metal ions, but having desirable properties (for example optical properties). Preferably, the glass substrate is untempered.

A material according to the invention also consists of a substrate coated with at least one thin transparent conductive film based on indium zinc or indium tin mixed oxides or on aluminum-doped or gallium-doped zinc oxide, based on niobium-doped titanium oxide, based on cadmium stannate and/or zinc stannate, or based on fluorine-doped and/or antimony-doped tin oxide.

In particular, one particularly advantageous material, which could not be obtained by the techniques known hitherto, consists of a substrate made of untempered glass coated with at least one film based on aluminum-doped or gallium-doped zinc oxide. This material is characterized in that the film based on aluminum-doped or gallium-doped zinc oxide has an RMS roughness not exceeding 10 nm and a sheet resistance not exceeding 15 ohms. The RMS roughness is calculated from an AFM (atomic force microscopy) measurement carried out on a specimen measuring one square micron. Preferably, the RMS roughness preferably even does not exceed 9 nm, or 8 nm and even 6 nm or 5 nm.

Such films of such low resistivity (with quite a high thickness, sometimes equal to or greater than 500 nm) and nevertheless with such a low roughness were only able to be obtained hitherto by a tempering treatment. In contrast, films having such a low resistivity were able to be obtained on untempered glass by magnetron sputtering deposition carried out on a heated substrate, but in this case the roughnesses obtained were much higher.

The films of the various materials that have just been described may of course have any one of the features described throughout the text, either alone or in combination with other features that are also described therein.

The substrates obtained according to the invention may be used in single, multiple or laminated glazing, in mirrors or in glass wall coverings. In the case of multiple glazing comprising at least two glass sheets separated by a gas layer, it is preferable for the thin film to be placed on the side in contact with said gas layer. The substrates may also be used in photovoltaic glazing or in solar panels, the thin film treated according to the invention being for example an upper electrode based on ZnO:Al or ZnO:Ga in multilayer coatings based on chalcopyrites (especially of CIS type, i.e. $CuInSe_2$) or based on amorphous and/or polycrystalline silicon, or else based on CdTe. They may also be used in display screens of the LCD (liquid crystal display), OLED (organic light-emitting diode) or FED (field emission display) type, the thin film treated according to the invention being for example an electroconductive film of ITO. They may also be used in electrochromic glazing, the thin film treated according to the invention being for example an upper transparent electroconductive film, as taught in application FR-A-2 833 107.

The invention will be illustrated by the following nonlimiting embodiment examples.

Example 1

A soda-lime-silica glass substrate obtained by the float process and then cut so that its size was 3 m in width by 6 m in length was coated in a known manner by the magnetron sputtering process with a thin titanium oxide film 10 nm in thickness. In a first example, a 20 nm thick silica film was interposed between the substrate and the titanium oxide film (specimen A). In a second example, the titanium oxide film was deposited directly on the substrate (specimen B).

A device comprising:
a $CO_2$ laser emitting radiation at a wavelength of 10.6 microns focused on the $TiO_2$ film, the width of the spot being about 0.3 to 0.5 mm; and a system for rapidly moving the laser (at around 3 to 5 meters/second) in a direction perpendicular to the running direction of the substrate, was inserted between the exit of the magnetron line and the storage device.

The temperature of the glass substrate during the treatment did not exceed 50° C., measured by pyrometry on the opposite side of the substrate to the side bearing the thin-film coating.

Table 1 below indicates the photocatalytic activity of the film before treatment and after treatment.

The photocatalytic activity corresponds to a measurement of the rate of degradation of methylene blue in the presence of ultraviolet radiation. An aqueous methylene blue solution was placed in contact with the coated substrate in a sealed cell (the substrate forming the bottom of the cell). After exposure to ultraviolet radiation for 30 minutes, the methylene blue concentration was determined by a light transmission measurement. The photocatalytic activity value (denoted by Kb and expressed in $g.l^{-1}.min^{-1}$) corresponds to the reduction in methylene blue concentration per unit exposure time.

TABLE 1

| Specimen | Kb before treatment | Kb after treatment |
| --- | --- | --- |
| A | <7 | 25 |
| B | <7 | 23 |

The substantial increase in photocatalytic activity after treatment according to the invention illustrates the improvement in the crystallinity of the titanium oxide film. The similarity of the values obtained depending on whether an underlayer was interposed or not between the substrate and the titanium oxide film testifies to the fact that the low amount of heating of the substrate does not cause significant diffusion of alkali metal ions into the titanium oxide film. The treatment according to the invention therefore makes the alkali-metal-ion diffusion barrier underlayer unnecessary.

Example 2

A soda-lime-silica glass substrate obtained by the float process and then cut so that its size was 3 m in width by 6 m in length was coated in a known manner by the magnetron sputtering process with a thin-film multilayer coating that included a silver film, said silver film giving the glass low-emissivity properties.

This multilayer coating comprised, in the following order (from the substrate to the outer surface), the following oxide, metallic or nitride films, the geometric thicknesses being indicated in brackets:

glass/$SnO_2$ (20 nm)/ZnO (15 nm)/Ag (8.5 nm)/Ni—Cr/ZnO (15 nm)/$Si_3N_4$ (25 nm).

A device comprising:

a neodymium-doped YAG (yttrium aluminum garnet, $Y_2Al_{15}O_2$) laser emitting, in continuous or pulsed mode, radiation with a wavelength of 1.09 microns focused onto the silver film, the width of the spot being about 0.3 to 0.5 mm; and a system for rapidly moving the laser (at around 3 to 5 meters/second) in a direction perpendicular to the running direction of the substrate, was inserted between the exit of the magnetron line and the storage device.

The temperature of the glass substrate during the treatment did not exceed 50° C., measured by pyrometry at the opposite side of the substrate to that bearing the thin-film coating.

Table 2 below indicates the change in the following properties after treatment:

the light transmission under illuminant $D_{65}$, calculated from an experimental spectrum, taking the standard illuminant $D_{65}$ as reference and the "CIE 1964" reference observer, for a double glazing unit having glass sheets 4 mm in thickness and the gas layer (a mixture of 90% argon and 10% air) having a thickness of 16 mm, the transmission being denoted by $T_L$ and expressed in percent;

the sheet resistance, denoted by $R_\square$ and expressed in ohms; and the normal emissivity at a temperature of 283 K calculated according to the EN 12898 standard from a reflection spectrum in the 5-50 micron spectral range, denoted by $\epsilon_n$ and expressed in percent.

The latter two properties (sheet resistance and emissivity), which illustrate the electrical conductivity and low-emissivity performance of the film, reflect the degree of crystallization and the size of the crystals of the silver film, since better crystallized silver films have both a higher electrical conductivity and better emissivity properties.

TABLE 2

| $T_L$ (%) | | $R_\square$ (Ω) | | $\epsilon_n$ (%) | |
| --- | --- | --- | --- | --- | --- |
| before | after | before | after | before | after |
| 77.0 | 78.3 | 5.0 | 4.5 | 5.5 | 5.0 |

The changes due to the treatment in terms of sheet resistance and normal emissivity are around 10%. These results show that the treatment of the multilayer coating (and especially the treatment of the silver film) using the infrared laser had the consequence of improving the crystallization of the silver film, characterized in particular by a higher degree of crystallization and a larger crystal size. It may also be noted that there is a significant increase in the light transmission of the glazing obtained.

Example 3

In this example, a coated substrate identical to that of Example 2, therefore coated with a multilayer coating that included a silver film, was used.

The heating process was induction heating, carried out using an inductor with a geometry specifically suitable for the treatment of flat surfaces. The frequency was 2 MHz, it being possible to vary the power around a few kW.

The temperature of the glass substrate during the treatment, which lasted only a few seconds, did not exceed 150° C.

Table 3 below indicates the change in the properties described in the case of Example 2.

TABLE 3

| $T_L$ (%) | | $R_\square$ (Ω) | | $\epsilon_n$ (%) | |
| --- | --- | --- | --- | --- | --- |
| before | after | before | after | before | after |
| 76.9 | 77.5 | 5.0 | 4.6 | 5.5 | 5.1 |

The changes in sheet resistance and in emissivity, quite comparable to those induced by the infrared laser treatment, again testify to an increase in the degree of crystallization of the silver film.

Example 4

In this example, coated substrates identical to those of Example 1, therefore coated with a multilayer coating that included a titanium oxide film, were used.

The heating process employed involved contact with a flat surface heated to 700° C. for 1 second. The temperature of the glass (on the opposite side to the film) did not exceed 150° C. during the treatment.

Table 4 below indicates the photocatalytic activity before and after treatment.

TABLE 4

| Specimen | Kb before treatment | Kb after treatment |
|---|---|---|
| A | <7 | 22 |
| B | <7 | 23 |

The values obtained are similar to those obtained in Example 1.

Example 5

In the context of this example, a substrate identical to that treated according to Examples 2 and 3 was heated using a plasma torch. The plasma gas was an argon/hydrogen or nitrogen/hydrogen mixture in a 4:1 ratio.

The plasma torch, with a power of 25 to 40 kW, was mounted on a device for rapidly moving it (at around 1 to 4 meters/second) in a direction perpendicular to the running direction of the substrate. The width of the zone affected by the plasma torch was about 3 to 10 mm.

The temperature of the glass substrate during the treatment did not exceed 90° C.

Table 5 below shows the changes due to the heating in terms of light transmission, sheet resistance and normal emissivity.

TABLE 5

| $T_L$ (%) | | $R_\square$ (Ω) | | $\epsilon_n$ (%) | |
|---|---|---|---|---|---|
| before | after | before | after | before | after |
| 77.0 | 78.5 | 5.0 | 4.4 | 5.5 | 4.9 |

Table 6 below details the same properties, but for a multilayer coating in which the silver film had a thickness of 15 nm.

TABLE 6

| $T_L$ (%) | | $R_\square$ (Ω) | | $\epsilon_n$ (%) | |
|---|---|---|---|---|---|
| before | after | before | after | before | after |
| 71.0 | 72.0 | 2.2 | 2.0 | 2.4 | 2.2 |

As in the case of Examples 2 and 3, the heating results in improved properties, a sign of better crystallization of the silver film.

Example 6

In this example, coated substrates identical to those of Examples 1 and 4, therefore coated with a multilayer coating that included a titanium oxide film, were used.

The plasma treatment device was identical to that described in the case of Example 5. The temperature of the glass substrate during the treatment did not exceed 90° C.

Table 7 below indicates the photocatalytic activity of the titanium oxide film before and after treatment.

TABLE 7

| Specimen | Kb before treatment | Kb after treatment |
|---|---|---|
| A | <7 | 25 |
| B | <7 | 22 |

Example 7

In the context of this example, the same coated substrate as that treated in Examples 2, 3 and 5 underwent flame heating. The fuel was propane, the oxidant being air. Oxygen also enabled good results to be obtained.

The coated substrate, after deposition within the magnetron deposition chamber, was moved at a constant speed beneath a stationary flame treatment rig, the width of which was equal to or wider than the width of the substrate, the latter running at a speed of between 2 and 10 meters/minute beneath the rig. The film to be treated was placed in the hottest region of the flame.

However, the temperature of the glass substrate during the treatment did not exceed 100° C.

Table 8 below also shows a favorable change in crystallization of the silver film.

TABLE 8

| $T_L$ (%) | | $R_\square$ (Ω) | | $\epsilon_n$ (%) | |
|---|---|---|---|---|---|
| before | after | before | after | before | after |
| 77.0 | 78.2 | 5.1 | 4.5 | 5.6 | 5.0 |

Example 8

In this example, coated substrates identical to those of Examples 1, 4 and 6, therefore coated with a multilayer coating that included a titanium oxide film, were used.

The treatment was similar to that undergone in the case of Example 7 (flame treatment). The glass temperature (on the side opposite the film) did not exceed 150° C.

Table 9 below indicates the photocatalytic activity values before and after treatment.

TABLE 9

| Specimen | Kb before treatment | Kb after treatment |
|---|---|---|
| A | <7 | 20 |
| B | <7 | 18 |

Example 9

A film of mixed indium tin oxide (ITO) 500 nm in thickness was deposited on a glass substrate in a known manner by magnetron sputtering.

Its sheet resistance was 20Ω, testifying to a very predominantly amorphous character of the film.

The treatment was similar to that undergone in the case of Example 7 (flame treatment), the temperature of the glass (on the opposite side to the film) not exceeding 150° C.

After treatment, the sheet resistance of the film was 4Ω, signifying an appreciable increase in its degree of crystallization.

Example 10

A transparent conductive film based on aluminum-doped zinc oxide 200 nm in thickness was deposited on a glass substrate by a magnetron sputtering process.

The treatment undergone was similar to that of Example 5 (using a plasma torch).

Table 10 below indicates the sheet resistance, light absorption, electron mobility and electron density values (the latter two being measured by the Hall effect) before and after treatment.

TABLE 10

| Absorption (%) | | $R_\square$ (Ω) | | Electron density ($\times 10^{20} \cdot cm^{-3}$) | | Mobility ($cm^2/V \cdot s$) | |
|---|---|---|---|---|---|---|---|
| before | after | before | after | before | after | before | after |
| 8.5 | 3.2 | 106 | 35 | 1.3 | 2.6 | 18 | 28 |

The process according to the invention therefore allows the electron conduction properties to be considerably improved thanks to the improvement in crystallization of the film. The latter enables not only the electron mobility to be increased by the reduction in grain boundaries, but also the density of carriers by reducing crystal defects. The resistivity after treatment is thus divided by a factor ranging from 2 to 3.

The RMS roughness of the film after treatment was 3 nm, calculated from an AFM measurement carried out on a specimen measuring one square micron.

In the case of a treatment carried out on a multilayer coating that comprised, in addition to the doped ZnO film, a protective underlayer and a protective overlayer, the improvement was less (about 35%).

Example 11

A transparent conductive film based on aluminum-doped zinc oxide 180 nm in thickness was deposited on a glass substrate using a magnetron sputtering process.

The treatment undergone was similar to that of Example 7 (flame treatment).

Table 11 below shows the sheet resistance and light transmission values before and after treatment.

TABLE 11

| Transmission (%) | | $R_\square$ (Ω) | |
|---|---|---|---|
| before | after | before | after |
| 72.5 | 75.0 | 120 | 60 |

The RMS roughness of the film after treatment was 3 nm, calculated from an AFM measurement carried out on a specimen measuring one square micron.

The same type of treatment was carried out on an aluminum-doped zinc oxide film 750 nm in thickness. The sheet resistance went from 26 ohms (before treatment) to 9.7 ohms (after treatment) for an RMS roughness of between 3 and 5 nm.

Example 12

A transparent conductive film based on aluminum-doped zinc oxide (190 nm in thickness) was deposited on a glass substrate by a magnetron sputtering process.

The treatment undergone was similar to that of Example 1 ($CO_2$ laser treatment).

Table 12 below indicates the sheet resistance and light transmission values before and after treatment.

TABLE 12

| Transmission (%) | | $R_\square$ (Ω) | |
|---|---|---|---|
| before | after | before | after |
| 74.4 | 78.3 | 94.8 | 40.5 |

The RMS roughness of the film after treatment was 3 nm, calculated from an AFM measurement carried out on a specimen measuring one square micron.

Example 13

Comparative Example

A substrate coated with a multilayer coating that included a silver film already described in Examples 2, 3, 5 and 7, but in which the thickness of the silver film was 9 nm, was, after deposition, moved beneath a series of lamps emitting infrared radiation and heating without discrimination both the film and the substrate.

The power of the lamp was about 150 kW/m² and the wavelength of the radiation emitted was between 1 and 3 microns.

Table 13 below shows that the heating using the lamps significantly improves the crystallization of the silver films.

However, the temperature of the substrate on the opposite side to the side bearing the multilayer coating exceeded 300° C. during the treatment, causing most of the treated glass sheets to break.

TABLE 13

| $T_L$ (%) | | $R_\square$ (Ω) | | $\epsilon_n$ (%) | |
|---|---|---|---|---|---|
| before | after | before | after | before | after |
| 77.2 | 78.5 | 4.6 | 3.8 | 5.1 | 4.3 |

Example 14

Comparative Example

In this example, coated substrates identical to those of Example 1, therefore coated with multilayer coatings that included a $TiO_2$ film, were used.

The treatment was carried out by moving the substrate after deposition beneath a series of lamps emitting infrared radiation and heating without discrimination both the film and the substrate.

The power of the lamp was about 150 kW/m² and the wavelength of the radiation emitted was between 1 and 3 microns. Only a small portion of the radiation was absorbed by the substrate and the film.

Table 14 below shows that the heating using the lamps improves the photocatalytic activity of the TiO₂ films.

TABLE 14

| Specimen | Kb before treatment | Kb after treatment |
|---|---|---|
| A | <7 | 25 |
| B | <7 | <10 |

However, for heating times of 2 to 3 minutes, the temperature of the substrate on the opposite side to the side bearing the multilayer coating exceeded 300° C. during the treatment, causing most of the glass sheets treated to break.

The substantial heating of the substrate furthermore caused sodium to diffuse into the film, considerably reducing the photocatalytic activity when no underlayer was employed (the case of Example B).

The invention claimed is:

1. A process for increasing the degree of crystallization of at least one thin continuous film deposited on a first side of a substrate while keeping the film continuous and without melting the film, the process comprising:
   heating the film with a laser, wherein at every point on said at least one thin film that is heated to a temperature of at least 300° C. using a laser, the temperature at no point on the opposite side of said substrate to said first side exceeds 150° C., thereby increasing the degree of crystallization of said thin film while keeping it continuous and without melting said thin film,
   wherein the laser simultaneously irradiates the entire width of the substrate, and
   wherein the thin film is based on at least one oxide selected from the group consisting of indium zinc oxide, indium tin oxide, gallium-doped zinc oxide, niobium-doped titanium oxide, cadmium stannate, zinc stannate, fluorine-doped tin oxide, antimony-doped tin oxide, and fluorine- and antimony-doped tin oxide and wherein the thin film does not contain a metallic functional layer.

2. The process as claimed in claim 1, wherein the substrate is made of glass.

3. The process as claimed in claim 1, wherein a temperature not exceeding 100° C. is maintained at any point on the opposite side of the substrate to the side on which the thin film is deposited.

4. The process as claimed in claim 1, wherein each point on the thin film is raised to a temperature of 300° C. or higher for a time not exceeding 1 second.

5. The process as claimed in claim 1, wherein the degree of crystallization obtained is at least 20%.

6. The process as claimed in claim 1, wherein the substrate has at least one dimension of 1 m or higher.

7. The process as claimed in claim 1, wherein the thin film is based on at least one oxide selected from the group consisting of indium zinc oxide, indium tin oxide, fluorine doped tin oxide, antimony doped tin oxide, and fluorine- and antimony-doped tin oxide.

8. The process as claimed in claim 1, wherein the thin film before treatment does not contain any aqueous or organic solvent, and is obtained by sputtering.

9. A process for obtaining a material comprising a substrate and at least one thin film, wherein said at least one thin film is deposited on said substrate by magnetically enhanced (magnetron) sputtering and wherein said at least one thin film is subjected to the process as claimed in claim 1.

10. The process as claimed in claim 1, wherein the laser is an excimer laser.

11. The process as claimed in claim 1, wherein the laser is a fiber-guided laser.

12. The process as claimed in claim 1, wherein the laser is a fiber laser.

13. The process as claimed in claim 1, wherein the laser emits radiation with a wavelength from 0.5 to 5 microns.

14. The process as claimed in claim 1, wherein the laser emits infrared radiation.

15. The process as claimed in claim 1, wherein the degree of crystallization obtained is at least 50%.

16. The process as claimed in claim 1, wherein the degree of crystallization obtained is at least 70%.

17. The process as claimed in claim 1, wherein the degree of crystallization obtained is at least 90%.

* * * * *